(12) United States Patent
Wang et al.

(10) Patent No.: US 9,601,647 B2
(45) Date of Patent: Mar. 21, 2017

(54) CONVERTING INFRARED LIGHT INTO BROADBAND VISIBLE LIGHT AT HIGH EFFICIENCY USING LANTHANIDE-SENSITIZED OXIDES

(71) Applicant: The Chinese University of Hong Kong, Shatin, New Territories (HK)

(72) Inventors: Jianfang Wang, Hong Kong (CN); Junxin Wang, Hong Kong (CN); Tian Ming, Hong Kong (CN)

(73) Assignee: The Chinese University of Hong Kong, Shatin, N.T. (HK)

( * ) Notice: Subject to any disclaimer, the term of this patent is extended or adjusted under 35 U.S.C. 154(b) by 0 days.

(21) Appl. No.: 14/279,128

(22) Filed: May 15, 2014

(65) Prior Publication Data

US 2015/0021499 A1    Jan. 22, 2015

Related U.S. Application Data

(60) Provisional application No. 61/847,925, filed on Jul. 18, 2013.

(51) Int. Cl.
*F21V 9/00* (2015.01)
*G02B 5/02* (2006.01)
(Continued)

(52) U.S. Cl.
CPC ........ *H01L 31/055* (2013.01); *H01L 31/0543* (2014.12); *H01L 31/0547* (2014.12); *H01L 33/502* (2013.01); *Y02E 10/52* (2013.01)

(58) Field of Classification Search
USPC ........................................ 250/492.1; 252/582
See application file for complete search history.

(56) References Cited

U.S. PATENT DOCUMENTS

2006/0227829 A1* 10/2006 Ushinsky .............. H01S 3/0602
372/39

OTHER PUBLICATIONS

Yang Yang, Yunpeng Li, Luelue Xiang, Xiangyang Ma, and Deren Yang, Low-voltage driven ~1.54 lm electroluminescence from erbium-doped ZnO/p+-Si heterostructured devices: Energy transfer from ZnO host to erbium ions, Applied Physics Letters 102, 181111 (2013), VC 2013 AIP Publishing LLC.*

(Continued)

*Primary Examiner* — Bijan Ahvazi
(74) *Attorney, Agent, or Firm* — Kilpatrick Townsend & Stockton LLP (57) ABSTRACT

The present invention includes upconversion materials such as lanthanide-sensitized oxides that are useful for converting low-energy photons into high-energy photons. Because silicon-based solar cells have an intrinsic optical band-gap of 1.1 eV, low-energy photons having a wavelength longer than 1100 nm, e.g., infrared photons, cannot be absorbed by the solar cell and used for photovoltaic energy conversion. Only those photons that have an energy equal to or greater than the solar cell's band gap, e.g., visible photons, can be absorbed and used for photovoltaic energy conversion. The oxides described herein transform photons having an energy less than the energy of a solar cell's band gap into photons having an energy equal to or greater than the energy of the band gap. When these oxides are incorporated into a solar cell, they provide more photons for photovoltaic energy conversion than otherwise would be available in their absence. Nearly 10% of the infrared photons incident on these oxides are upconverted into visible photons. This upconversion efficiency is more than twice as large as the upconversion efficiency for NaYF$_4$-based upconversion materials. The solar radiation energy conversion efficiency of a silicon-based solar cell will increase by 1.8% or greater by including the oxides described herein because they allow (Continued)

the solar cell to absorb and use are larger portion of the solar spectrum for photovoltaic energy conversion.

15 Claims, 2 Drawing Sheets

(51) Int. Cl.

| | |
|---|---|
| *G02C 7/10* | (2006.01) |
| *G02F 1/361* | (2006.01) |
| *G03B 11/00* | (2006.01) |
| *H01L 31/055* | (2014.01) |
| *H01L 31/054* | (2014.01) |
| *G01J 1/00* | (2006.01) |
| *G01N 21/00* | (2006.01) |
| *G01N 23/00* | (2006.01) |
| *H01L 33/50* | (2010.01) |

(56) References Cited

OTHER PUBLICATIONS

Nengli Wang, Xiyan Zhang, Zhaohui Bai, Haiying Sun, Quansheng Liu, Liping Lu, Xiaoyun Mi, Xiaochun Wang, Synthesis of nanocrystalline ytterbium-doped yttria by citrate-gel combustion method and fabrication of ceramic materials,Ceramics International 37 (2011) 3133-3138, 2011 Elsevier Ltd and Techna Group S.r.l. All rights reserved.*

Rao et al. (Monodisperse Mesoporous Silica Microspheres Formed by Evaporation-Induced Self Assembly of Surfactant Templates in Aerosols, Adv. Mater. 2002, 14, No. 18, 1301-1304.*

Peng Zhao, Yihua Zhu,* Xiaoling Yang, Kaicai Fan, Jianhua Shen and Chunzhong Li, Facile synthesis of upconversion luminescent mesoporous Y2O3:Er microspheres and metal enhancement using gold nanoparticles,RSC Adv., 2012, 2, 10592-10597.This journal is the Royal Society of Chemistry 2012.*

Li Li, Chia-Kuang Tsung, Tian Ming, Zhenhua Sun, Weihai Ni, Qihui Shi, Galen D. Stucky, and Jianfang Wang, Multifunctional Mesostructured Silica Microspheres from an Ultrasonic Aerosol Spray, Adv. Funct. Mater. 2008, 18, 2956-2962, 2008 Wiley-VCH Verlag GmbH & Co. KGaA, Weinheim.*

Li et al., "Rare-Earth-Doped Nanocrystalline Titania Microspheres Emitting Luminescence via Energy Transfer," *Advanced Materials*, 2008, 20, 903-908.

Li et al., "Multifunctional Mesostructured Silic Microspheres from an Ultrasonic Aerosol Spray," *Advanced Functional Materials*, 2008, 18, 2956-2962.

Auzel, "Upconversion of Anti Stokes Processes with f and d Ions in Solids," *Chem. Rev.* 2004, 139-173.

Boyer at al., "Absolute Quantum Yield Measurements of Colloidal $NaYF_4$: $Er^{3+}$, $Yb^{3+}$. Upconverting Nanoparticles," *Nanoscale*, 2010, 2, 1417-1419.

Fischer et al., "Enhancement of Silicon Solar Cell Efficiency by Upconversion: Optical and Electrical Characterization," *Journal of Applied Physics*, 108, 044912 (2010).

Gleckman, "Concentration of Sunlight to Solar-Surface Levels Using Non-Imaging Optics," *Nature*, vol. 339, May 18, 1989, 198-200.

Huang, et al., "Enhancing Solar Cell Efficiency: The Search for Luminescent Materials as Spectral Converters," *Chem. Soc. Rev.*, 2013, 42, 173-201.

Ireland et al., "A Combined Irradiance-Transmittance Solar Spectrum and Its Application to Photovoltaic Efficiency Calculations," *Science*, vol. 204, May 11, 1979, 611-613.

Page et al., "Upconversion-Pumped Luminescence Efficiency of Rare-Earth-Doped Hosts Sensitized with Trivalent Ytterbium," *J. Opt. Soc. Am.*, B/vol. 15, No. 3, Mar. 1998, 996-1008.

Patra et al., "Upconversion in $Er^{3+}$:$ZrO_2$ Nanocrystals,"*J. Phys. Chem. B*, 2002, 106, 1909-1912.

Shockley et al., "Detailed Balance Limit of Efficiency of *p-n* Junction Solar Cells," *Journal of Applied Physics*, vol. 32, No. 3, Mar. 1961, 510-519.

Suyver et al., "Upconversion Sprectroscopy and Properties of $NaYF_4$ doped with $Er^{3+}$, $Tm^{3+}$ and/or $Yb^{3+}$," *Journal of Luminescence* 117 (2006) 1-12.

Van Der Ende et al., "Lanthanide Ions as Spectral Converters for Solar Cells," *Phys. Chem. Phys.* 2009, 11, 11081-11095.

Wang et al., "Simultaneous Phase and Size Control of Upconversion Nanocrystals Through Lanthanide Doping," *Nature*, vol. 463, Feb. 25, 2010, 1061-1065.

Wang et al., "Rare-earth Ion Doped Up-Conversion Materials for Photovoltaic Applications," *Adv. Mater.* 2011, 23, 2675-2680.

Zou, et al., "Broadband Dye-Sensitized Upconversion of Near-Infrared Light," *Nature Photonics*, vol. 6, Aug. 2012, 560-564.

* cited by examiner

CONVERTING INFRARED LIGHT INTO BROADBAND VISIBLE LIGHT AT HIGH EFFICIENCY USING LANTHANIDE-SENSITIZED OXIDES

RELATED APPLICATIONS

This application claims priority to U.S. Provisional Patent Application No. 61/847,925, filed Jul. 18, 2013, the contents of which are incorporated by reference in the entirety for all purposes.

BACKGROUND OF THE INVENTION

Silicon-based solar cells, due to an intrinsic optical band-gap of 1.1 eV, cannot absorb light having a wavelength longer than 1100 nm, e.g., infrared light. Light having a wavelength longer than 1100 nm does not have sufficient energy to excite an electron across the solar cell's band-gap, from a valence band to a conduction band, for photovoltaic energy conversion to occur. Because a significant part of the solar spectrum includes light having a wavelength longer than 1100 nm, silicon-based solar cells are currently unable to use approximately 30% of the sun's radiation for electricity generation. Persons having ordinary skill in the art to which the instant invention relates refer to this issue as the Shockley-Queisser limit of silicon-based solar cells.

Materials that convert low-energy photons, e.g., infrared light, into high-energy photons, e.g., visible light, are referred to as upconversion materials.

The highest efficiency upconversion materials currently known are based on rare earth ion co-doped $NaYF_4$ particles which have quantum yields in the range of 0.005% to 0.3%. $NaYF_4$ nanoparticles doped with 2% $Er^{3+}$ and 20% $Yb^{3+}$ are typical examples. The reported particle sizes for these rare earth doped $NaYF_4$ particles ranges from 10 to 100 nm. A quantum yield of 3% has also been observed for a bulk sample of $NaYF_4$ (Nanoscale, 2010, 2, 1417-1419).

Accordingly, there is a need in the related field for new materials and methods which overcome the Shockley-Queisser limit to silicon-based solar cells. The present invention provides new solid-state materials that upconvert infrared light into visible light, as well as methods of making and using the same, that are useful for overcoming the Shockley-Queisser limit and that have a surprisingly high infrared to visible light upconversion efficiency.

BRIEF SUMMARY OF THE INVENTION

In one aspect, the present invention provides a doped oxide which includes A) an oxide host having: i) a melting point greater than 1800 K; and ii) a room temperature thermal conductivity lower than 45 $W \cdot m^{-1} \cdot K^{-1}$; and B) a dopant distributed in the oxide host.

In a second aspect, the present invention provides methods for preparing a doped oxide. One method includes these steps: A) providing a solution that includes i) a structure directing block co-polymer; ii) a metal alkoxide or metal halide; iii) at least one organic acid; iv) at least one inorganic acid; and v) a lanthanide cation precursor. Next, the method includes B) stirring the provided solution for approximately one to ten hours; C) nebulizing the solution in an ultrasonic humidifier; D) passing the nebulized solution through a furnace to produce microspheres; E) collecting the microspheres; and F) calcining the microspheres to prepare the doped oxides set forth herein. The lanthanide cation precursor includes but is not limited to lanthanide halides.

In a third aspect, the present invention provides methods for preparing a doped oxide that include these steps: A) providing an solution that includes i) a structure directing block co-polymer; ii) a metal alkoxide or metal halide; iii) at least one organic acid; iv) at least one inorganic acid; and v) a lanthanide cation precursor. Next, the method includes B) stirring the provided solution for approximately one to ten hours; C) drying the solution at 50 to 180° C. for 2 to 24 hours to form a powder; D) optionally collecting the powder; and E) calcining the powder to prepare a doped oxide set forth herein. The lanthanide cation precursor includes but is not limited to lanthanide halides.

In a fourth aspect, the present invention provides a method of generating white light from infrared light. The method includes directing infrared radiation onto a doped oxide described above to stimulate the dopant and thereby generate white light.

In a fifth aspect, the present invention provides a photovoltaic device or broadband light source comprising a doped oxide, which includes A) an oxide host having: i) a melting point greater than 1800 K; and ii) a room temperature thermal conductivity lower than 45 $W \cdot m^{-1} \cdot K^{-1}$; and B) a dopant distributed in the oxide host.

In a sixth aspect, the present invention provides a doped oxide prepared by a method set forth herein.

BRIEF DESCRIPTION OF THE DRAWINGS

FIGS. 1a and 1b show representative scanning electron microscopy (SEM) and transmission electron microscopy (TEM) images of sensitized mesoporous $ZrO_2$ microspheres having $Yb^{3+}$ dopants. FIG. 1c shows the broadband emission spectrum, which includes the visible region, that is observed when near infrared light is directed onto the sensitized mesoporous $ZrO_2$. FIGS. 1d and 1e show digital images of the $Yb^{3+}$ doped $ZrO_2$ powder in the bottle without and with excitation of infrared light. The scale bar in FIG. 1a is 1 μm. The scale bar in FIG. 1b is 50 nm.

DETAILED DESCRIPTION OF THE INVENTION

General

The present invention provides upconversion materials including but not limited to lanthanide-sensitized oxides that are useful for converting low-energy infrared photons into high-energy visible photons. The oxides described herein transform photons having an energy less than the energy of a solar cell's band gap into photons having an energy equal to or greater than the energy of a solar cell's band gap. Nearly 10% of the infrared photons incident on the sensitized oxides set forth herein are upconverted into visible photons. The present invention also provides methods of making and using these sensitized upconversion materials.

As noted herein, the doped oxides of the present invention have unique properties such as but not limited to having: i) a melting point greater than 1800 K; and ii) a room temperature thermal conductivity lower than 45 $W \cdot m^{-1} \cdot K^{-1}$. These doped oxides comprise a host oxide, such as $ZrO_2$, and a dopant, such as $Yb^{3+}$. Many other host oxides and dopants can be used alone as well as in a variety of combinations to produce a doped oxide with a range of adsorption and emission properties. Dopants, such as $Yb^{3+}$, absorb infrared light. Depending on the amount of a dopant which is present in a host, as well as the number and amount of other types of dopants which may also be present in a host, a range of wavelengths can be absorbed by a doped oxide. When infrared light is absorbed by a dopant, or by a series of dopants, the dopants absorbs the energy of the infrared light. Next, the dopant transfers this absorbed energy to the host oxide through lattice vibrations. Once the host oxide acquires a sufficient amount of energy through lattice vibrations, the host oxide emits visible light. In doing so, infrared light incident on a doped oxide of the present invention is upconverted to visible light that is emitted from the doped oxide.

DEFINITIONS

As used herein, the term "dopant" refers to an impurity or added element that is incorporated into a host material at low concentrations in order to modify the electrical or optical properties of the host material. For example, a dopant can include a lanthanide cation, e.g., $Yb^{3+}$, and the host can include $ZrO_2$. In this case, the electrical and optical properties of $ZrO_2$ can be modified by the amount of $Yb^{3+}$ that is doped into the $ZrO_2$.

As used herein, the term "doped" refers to a material that includes a dopant. In the present invention, host materials are doped with a dopant, e.g., a lanthanide cation.

As used herein, the term "oxide" refers to a material, chemical, or compound that includes oxygen as a constituent element. Oxides, as used herein, include, but are not limited to, $SiO_2$, $ZrO_2$, and $Al_2O_3$.

As used herein, the term "host" refers to a material or structure into which a dopant can be incorporated or doped. A host material can have vacant space in the form of, for example but not limited to pores, interstitial sites, and grain boundaries and into which dopants can be placed. Dopants can be incorporated into these vacant spaces in the host as well as substitute and replace atoms already present in the host prior to the doping event.

As used herein, the term "melting point" refers to the temperature at which a material melts.

As used herein, the term "thermal conductivity" is a measure of a material's ability to conduct and dissipate heat.

As used herein, the phrase "rare earth cation" refers to the positively charged ions of any rare earth element. The rare earth elements include but are not limited to, for example, Sc, Y, La, Ce, Pr, Nd, Pm, Sm, Eu, Gd, Tb, Dy, Ho, Er, Tm, Yb, and Lu.

As used herein, the term "pores" refers to an opening or cavity or internally enclosed spaces within a material. For example, a mesoporous oxide is an oxide, e.g., $SiO_2$, that has pore openings through which fluids and radiation can penetrate and which are meso dimensioned. These pores are often formed by precipitating an oxide around a polymer, e.g., a block co-polymer that assembles into shapes resembling pores. Once the oxide is precipitated around an assembled polymer, the polymer can be burned away during calcination to leave an oxide having internally vacant spaces where the polymer used to reside prior to calcination.

As used herein, the term "morphology" refers to the physical shape and size of the doped oxide described herein. For example, the doped oxides can be prepared as irregular powders as well as symmetrical spheres. Further, and for example, the doped oxides can be prepared as micro-spheres, having dimensions on the order of micrometers, as well as milli-spheres, having physical dimensions on the order of millimeters.

The term "mesoporous" used herein includes any particle, material, nanoparticle or nanomaterial characterized by an average pore diameters of 2-50 nm. Examples of mesoporous materials include, without limitation, mesoporous silica nanoparticles, alumina nanofibers, carbon nanotubes, titania nanotubes and thin films, and a combination thereof.

The terms "doped mesoporous material" includes nanoparticles or nanomaterials that are sensitized or doped with a dopant, e.g., a rare earth cation.

As used herein, the term "micro-spheres" refers to spheres that have a diameter of about 10 to about 50 µm.

As used herein, the term "milli-spheres" refers to spheres that have a diameter of about 0.5 to about 3 mm.

As used herein, the phrase "white light" includes visible light comprising more than one color.

As used herein, the phrase "stimulate the dopant" refers to a process whereby a dopant absorbs a photon of energy.

As used herein, the phrase "structure directing co-polymer" refers to a polymer that assembles into predictable shapes at predetermined concentrations in solution. These polymers are used as templates around which oxides are precipitated in order to impart a particular micro or meso structure or morphology to the precipitated oxide. Examples include but are not limited to the block co-polymer F127 or P123.

As used herein, the phrase "metal alkoxide" refers to an oxide precursor reagent that includes a metal and an organic alkoxide group, e.g., zirconium butoxide ($Zr(OBu)_4$).

As used herein, the phrase "lanthanide cation precursor" refers to a chemical reagent that produces a lanthanide cation by, for example, dissolving in a solvent.

Lanthanide cation precursors include but are not limited to lanthanide halides. For example, a lanthanide cation precursor includes but is not limited to $YbCl_3$ which dissolves in solvents to produce the lanthanide cation, $Yb^{3+}$.

As used herein, the term "nebulizing" refers to a process whereby a liquid or solution is converted into a fine spray or mist. The methods set forth herein include steps whereby a precursor solution to a doped oxide is converted into a fine spray or mist by introducing a fast moving carrier gas, e.g., $N_2$, into the precursor solution. The methods set forth herein also include steps whereby this nebulized solution is introduced into a furnace for further processing.

As used herein, the term "calcining" refers to a process whereby a material is heated to fused part of the material while also driving off volatile matter. For example, a metal alkoxide and block co-polymer solution can be mixed such that they assemble into a predictable physical architecture, e.g., mesoporous architecture. Once assembled, the material can be heated to a high temperature in air to 1) burn away the block co-polymer, and 2) crystallize the oxide formed from the metal alkoxide reagent. The heating in air fuses the oxide into crystals and drives off organic matter that typically burns out as $CO_2$.

As used herein, the phrase "residence time" refers to the time during which a material resides in a particular place. In some of the method of making the materials described herein, a nebulized solution resides in a heated furnace for approximately 5 seconds.

As used herein, the term "photovoltaic" refers an electrical voltage that is caused or produced by the absorption of light in a material.

As used herein, the phrase "broadband light source" refers to a source of light that has a large spectral width, typically between 200-900 nm in width.

As used herein, the phrase "color rendering index" refers to a quantitative measure of the ability of a light source to reproduce the colors of various objects in comparison with an ideal or natural light source. Numerically, the highest possible color render index is 100. Also as used herein, the phrase "high color rending index" refers to the color rendering index that is equal to or greater than 90.

As used herein, the phrase "worm-like" refers to a shape that is tubular and may have twists and turns in the tubular structure. The tubes may be of varying dimensions and shapes. Tubes are typically 1-10 nm across, 1-500 nm long, and cylindrical in shape.

As used herein, the phrase "metal halide" refers to a compound having both a metal and a halogen atom, e.g., $MgCl_2$.

As used herein, the phrase "arc melting" refers to a process of melting a sample using an arc melting furnace. In this process, an arc forms between the charged material and the electrode. The charged material is heated by the current passing through it and also by the energy radiated by the arc.

As used herein, the phrase "sensitized oxide" refers to an oxide that is doped such that the oxide's electrical or optical properties is significantly altered as when compared to the oxide prior to being doped.

Methods of Upconverting Infrared Light to Visible Light

The doped oxides described herein have the ability to upconvert infrared photons into visible photons. In some embodiments, these materials include lanthanide ion sensitized oxides having a high melting point and low thermal conductivity. When infrared light is incident on these oxides, the light is absorbed by a lanthanide ion which then transfers the absorbed energy to the oxide matrix through lattice vibrations. These vibrations eventually generate thermal radiation that includes visible light. When the doped oxide matrix local temperature reaches 2800 K or above, the thermal radiation emission includes more than 10% visible light.

The type, intensity, and spectral range of the thermal radiation emitted from doped oxides depends on many factors including the element and concentration of the sensitizer or dopant and the type and morphology of the oxide matrix. Nearly 10% of 976 nm infrared light incident on a doped oxide described herein is upconverted to visible light. This energy conversion efficiency is more than twice of that of certain upconversion material, e.g., rare earth ion co-doped $NaYF_4$ particles.

In some embodiments, the doped oxides of the present invention have (i) high efficiency for converting infrared light into visible light. In certain embodiments, the doped oxides also have (ii) a broad and tunable absorption band spectrum which can be varied by the type and amount of the dopant. In some embodiments, the doped oxides also, when stimulated by infrared light, generate a (iii) broadband white light continuous emission. Some embodiments of the present invention include doped oxides that do not (iv) absorb in the visible region, do not suffer from (v) thermal quenching, are (vi) economical to produce, and (vii) are chemically stable. The doped oxides set forth herein may exhibit a high color rendering index above 98 and a correlated color temperature reaching up to 2800 K.

Sensitized Oxides

In some embodiments, the present invention provides a doped oxide, including A) an oxide host having: i) a melting point greater than 1800 K; and ii) a room temperature thermal conductivity lower than 45 $W \cdot m^{-1} \cdot K^{-1}$; and B) a dopant distributed in the oxide host. In some embodiments, the present invention provides a doped oxide that is a sensitized oxide.

The oxide hosts suitable for use with the present invention include $ZrO_2$, $SiO_2$, $Y_2O_3$, $MgO$, $TiO_2$, $Al_2O_3$, $ZnO$, or $CeO_2$, or combinations of $ZrO_2$, $SiO_2$, $Y_2O_3$, $MgO$, $TiO_2$, $Al_2O_3$, $ZnO$, or $CeO_2$. In certain embodiments, the host comprises $ZrO_2$. In certain other embodiments, the host comprises $SiO_2$. In some embodiments, the host comprises $Y_2O_3$. In other embodiments, the host comprises $MgO$. In certain embodiments, the host comprises $TiO_2$. In some embodiments, the host comprises $Al_2O_3$. In yet other embodiments, the host of $ZnO$. In certain embodiments, the host comprises $CeO_2$.

In some embodiments of the present invention, the dopant is uniformly distributed in the host. In some embodiments, the dopant is uniformly distributed across the surface of the host. In other embodiments, the dopant is uniformly distributed through the bulk of the host. The present invention includes embodiments having a host wherein the dopant is uniformly distributed and also having a host where the dopant is not uniformly distributed. The present invention also sets forth embodiments wherein two or more hosts are included and at least two of these hosts have a dopant therein that is uniformly distributed.

In some embodiments of the present invention, the dopant comprises a rare earth cation. In some embodiments, the dopant comprises $Yb^{3+}$, $Er^{3+}$, $Dy^{3+}$, $Tm^{3+}$, $Nd^{3+}$, or combinations thereof. In some embodiments, the dopant comprises $Yb^{3+}$. In other embodiments, the dopant comprises $Er^{3+}$. In some other embodiments, the dopant comprises $Dy^{3+}$. In certain embodiments, the dopant comprises $Tm^{3+}$. In yet other embodiments, the dopant comprises $Nd^{3+}$.

In some embodiments of the present invention, the dopant is present at a weight percent of about 1%-50%. In certain embodiments, the dopant is present at a weight percent of about 1%-5%. In certain other embodiments, the dopant is present at a weight percent of about 5%-10%. In some other embodiments, the dopant is present at a weight percent of about 10%-15%. In some embodiments, the dopant is present at a weight percent of about 15%-20%. In some other embodiments, the dopant is present at a weight percent of about 20%-25%. In certain embodiments, the dopant is present at a weight percent of about 25%-30%. In some embodiments, the dopant is present at a weight percent of about 30%-35%. In other embodiments, the dopant is present at a weight percent of about 35%-40%. In some embodiments, the dopant is present at a weight percent of about 40%-45%. In certain embodiments, the dopant is present at a weight percent of about 45%-50%. In some embodiments, the dopant is present at a weight percent of about 1%. In certain embodiments, the dopant is present at a weight percent of about 5%. In certain other embodiments, the dopant is present at a weight percent of about 10%. In other embodiments, the dopant is present at a weight percent of about 15%. In yet other embodiments, the dopant is present at a weight percent of about 20%. In some embodiments, the dopant is present at a weight percent of about 25%. In certain other embodiments, the dopant is present at a weight percent of about 30%. In some other embodiments, the dopant is present at a weight percent of about 35%. In certain embodiments, the dopant is present at a weight percent of about 40%. In some embodiments, the dopant is present at a weight percent of about 45%. In other embodiments, the dopant is present at a weight percent of about 50%. In yet other certain embodiments, the dopant is present at a weight percent of about 55%.

In some of the embodiments of the present invention, the doped oxides have pores ranging in size from 2-100 nm. In certain embodiments, the pores range in size from about 3-15 nm. In yet other embodiments, the pores rage in size from 1-5 nm, 3-5 nm, 3-8 nm 5-10 nm, 5-15 nm, 10-15 nm, or 12-15 nm or combinations thereof. In some embodiments, the present invention includes pores that are 3-15 nm in size.

In certain embodiments of the present invention, the doped oxides do not have pores.

In some of the embodiments described herein, the doped oxides do not include pores. In certain of the herein described methods for preparing a dope oxide, the structure directing block co-polymer may not be included in the method when forming a doped oxide not having pores.

In some embodiments, the present invention provides a doped oxide having a surface area of about 1 to 200 m²/g. In certain embodiments, the oxide has a surface area of about 100 m²/g.

In some of the embodiments of the present invention, the doped oxides have pores that are mesoporous. In certain embodiments, the pores are worm-like pores with no periodic ordering.

In some of the embodiments of the present invention, the doped oxides have a morphology selected from micro-spheres, milli-spheres, pellets, or powders.

In some embodiments, the morphology is micro-spheres and the micro-spheres have a diameter of about 10-50 μm. In some other embodiments, the diameter is about 10 μm. In some other embodiments, the diameter is about 20 μm. In yet other embodiments, the diameter is about 30 μm. In some embodiments, the diameter is about 40 μm. In certain embodiments, the diameter is about 50 μm. In some embodiments, the diameter is about 10-20 μm. In other embodiments, the diameter is about 10-30 μm. In yet other embodiments, the diameter is about 20-30 μm. In certain embodiments, the diameter is about 20-40 μm. In some embodiments, the diameter is about 20-50 μm. In some embodiments, the diameter is about 40-50 μm.

In some embodiments, the present invention provides a doped oxide wherein the morphology is milli-spheres having a diameter of about 0.5-10 mm. In some other embodiments, the diameter is about 1 mm. In some other embodiments, the diameter is about 0.5 mm. In yet other embodiments, the diameter is about 1 mm. In some embodiments, the diameter is about 2 mm. In certain embodiments, the diameter is about 5 mm. In some embodiments, the diameter is about 7 mm. In other embodiments, the diameter is about 10 mm. In yet other embodiments, the diameter is about 5-10 mm. In certain embodiments, the diameter is about 7-10 mm. In some embodiments, the diameter is about 10 mm.

In certain embodiments, the host is $ZrO_2$, the dopant is $Yb^{3+}$, the oxide has pores that are mesoporous, and the oxide has a microsphere morphology.

In some embodiments, the oxide is selected from Yb-doped $ZrO_2$, Tm-doped $ZrO_2$, Er-doped $ZrO_2$, Dy-doped $ZrO_2$, Nd-doped $ZrO_2$, Yb-doped $SiO_2$, Tm-doped $SiO_2$, Er-doped $SiO_2$, Dy-doped $SiO_2$, Nd-doped $SiO_2$, Yb-doped MgO, Tm-doped MgO, Er-doped MgO, Dy-doped MgO, or Nd-doped MgO.

In certain embodiments, the host is $ZrO_2$, the dopant is Yb, and the dopant is present in the host at about 3 to 50 percent by weight. In some of these embodiments, the dopant is present at about 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, or 50 percent by weight.

In certain embodiments, the host is $ZrO_2$, the dopant is Tm, and the dopant is present in the host at about 3 to 50 percent by weight. In some of these embodiments, the dopant is present at about 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, or 50 percent by weight.

In certain embodiments, the host is $ZrO_2$, the dopant is Er, and the dopant is present in the host at about 3 to 50 percent by weight. In some of these embodiments, the dopant is present at about 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, or 50 percent by weight.

In certain embodiments, the host is $ZrO_2$, the dopant is Dy, and the dopant is present in the host at about 3 to 50 percent by weight. In some of these embodiments, the dopant is present at about 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, or 50 percent by weight.

In certain embodiments, the host is $ZrO_2$, the dopant is Nd, and the dopant is present in the host at about 3 to 50 percent by weight. In some of these embodiments, the dopant is present at about 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, or 50 percent by weight.

In certain embodiments, the host is $SiO_2$, the dopant is Yb, and the dopant is present in the host at about 3 to 50 percent by weight. In some of these embodiments, the dopant is present at about 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, or 50 percent by weight.

In certain embodiments, the host is $SiO_2$, the dopant is Tm, and the dopant is present in the host at about 3 to 50 percent by weight. In some of these embodiments, the dopant is present at about 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, or 50 percent by weight.

In certain embodiments, the host is $SiO_2$, the dopant is Er, and the dopant is present in the host at about 3 to 50 percent by weight. In some of these embodiments, the dopant is present at about 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, or 50 percent by weight.

In certain embodiments, the host is $SiO_2$, the dopant is Dy, and the dopant is present in the host at about 3 to 50 percent by weight. In some of these embodiments, the dopant is present at about 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, or 50 percent by weight.

In certain embodiments, the host is $SiO_2$, the dopant is Nd, and the dopant is present in the host at about 3 to 50 percent by weight. In some of these embodiments, the dopant is present at about 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, or 50 percent by weight.

In certain embodiments, the host is MgO, the dopant is Yb, and the dopant is present in the host at about 3 to 50 percent by weight. In some of these embodiments, the dopant is present at about 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, or 50 percent by weight.

In certain embodiments, the host is MgO, the dopant is Tm, and the dopant is present in the host at about 3 to 50 percent by weight. In some of these embodiments, the dopant is present at about 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, or 50 percent by weight.

In certain embodiments, the host is MgO, the dopant is Er, and the dopant is present in the host at about 3 to 50 percent by weight. In some of these embodiments, the dopant is present at about 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, or 50 percent by weight.

In certain embodiments, the host is MgO, the dopant is Dy, and the dopant is present in the host at about 3 to 50 percent by weight. In some of these embodiments, the dopant is present at about 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, or 50 percent by weight.

In certain embodiments, the host is MgO, the dopant is Nd, and the dopant is present in the host at about 3 to 50 percent by weight. In some of these embodiments, the dopant is present at about 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, or 50 percent by weight.

In some of the embodiments of the present invention, the oxide has a chemical formula selected from $Yb_{0.5}Zr_{0.5}O_{1.75}$, $Tm_{0.2}Zr_{0.8}O_{1.9}$, $Er_{0.5}Zr_{0.5}O_{1.75}$, $Dy_{0.5}Zr_{0.5}O_{1.75}$, or $Nd_{0.5}Zr_{0.5}O_{1.75}$. In certain embodiments, the formula is $Yb_{0.5}Zr_{0.5}O_{1.75}$. In other embodiments, the formula is $Tm_{0.2}Zr_{0.8}O_{1.9}$. In some other embodiments, the formula is $Er_{0.5}Zr_{0.5}O_{1.75}$. In other embodiments, the formula is $Dy_{0.5}Zr_{0.5}O_{1.75}$. In certain other embodiments, the formula is $Nd_{0.5}Zr_{0.5}O_{1.75}$.

Compared to $NaYF_4$-based materials, the doped oxides described herein benefit from photon-phonon coupling and do not suffer from photon induced quenching effect. The doped oxides described herein also have a wider excitation window and wider emission band than some known $NaYF_4$-based materials.

When the doped oxides, described by the present invention, are incorporated into a solar cell, an approximate 1.8% net increase in efficiency for photovoltaic energy generation is expected. This is due in part to the fact that energy that was transmitted to the solar cell in the form of infrared radiation, and which would other be useless for photovoltaic energy generation, is upconverted to visible light that can be used for photovoltaic energy generation. By making more energy available for photovoltaic energy generation, the doped oxides of the present invention can, when included in a solar cell, potentially break through the Shockley-Queisser limit.

Method of Generating White Light

In some embodiments, the present invention provides a method for generating white light from infrared light. The method includes directing infrared radiation onto a doped oxide, described herein, to stimulate the dopant therein; thereby generating white light. In some embodiments, directing the infrared radiation includes operating a source of infrared light such that infrared radiation impinges onto a doped oxide, described herein. In some embodiments, when infrared radiation is incident on a doped oxide, described herein, the dopant is stimulated. In some embodiments, when the dopant is stimulated, the doped oxide, described herein, emits and, or, generates white light.

In some of the methods set forth herein, the white light is a continuous spectrum. In some embodiments, the white light is a continuous spectrum from about 380 nm to about 980 nm. In certain embodiments, the white light has a line width at half height greater than about 200 nm.

In some embodiments of the present invention, step B occurs at room temperature. In certain embodiments, step B occurs at about 20 or 25 or 30° C.

In some of the embodiments of the present invention, the methods using infrared radiation having a wavelength of from about 780 to about 1600 nm. In certain embodiments, the infrared radiation has a wavelength of about 976±15 nm.

In some of the methods of generating white light, described herein, the white light has a wavelength of from about 380 nm to about 780 nm. In some other embodiments, the white light has a wavelength of from about 380 nm to about 980 nm.

Almost 10% of the infrared photons incident on the doped oxides, described herein, are converted into visible photons. By incorporating these doped oxides into solar cells, photons having energy lower than the semiconductor band-gap can be converted into high energy photons, which can be absorbed by the solar cell. The compositions and methods set forth herein allows for the utilization of near infrared solar light in solar cells that otherwise could not use near infrared solar light for photovoltaic energy conversion.

Methods of Preparing a Doped Oxide

In some embodiments of the present invention, a method for preparing a doped oxide is provided. This method includes step A) providing an solution that comprises the following reagents or solvents: i) a structure directing block co-polymer; ii) a metal alkoxide or metal halide; iii) at least one organic acid; iv) at least one inorganic acid; and v) a lanthanide halide. Once this solution is provided, the methods include step B) stirring the solution for approximately one to ten hours. Next, the method includes step C) nebulizing the solution in an ultrasonic humidifier. Next, the method includes step D) passing the nebulized solution through a furnace to produce micro-spheres. Next, the method includes step E) collecting the micro-spheres. After collecting the micro-spheres, the method includes step F) calcining the micro-spheres. After step F, a doped oxide is obtained.

In some other embodiments of the present invention, a method for preparing a doped oxide is provided. The method includes these steps: A) providing an solution that includes i) a structure directing block co-polymer; ii) a metal alkoxide or metal halide; iii) at least one organic acid; iv) at least one inorganic acid; and v) a lanthanide cation precursor. Next, the method includes B) stirring the provided solution for approximately one to ten hours; C) drying the solution at 50 to 180° C. for 2 to 24 hours to form powder; D) collecting the powder; and E) calcining the powder to prepare a doped oxide set forth herein. After step E, a doped oxide is obtained.

In the methods set forth herein, the lanthanide cation precursor includes but is not limited to lanthanide halides.

In some of the methods set forth herein, the block co-polymer is selected from F127, P123, Brij56, and Brij58. In certain embodiments, the co-polymer is F127. In other embodiments, the co-polymer is P123. In yet other embodiments, the co-polymer is Brij56. In some other embodiments, the co-polymer is Brij58.

In some of the methods set forth herein, the metal alkoxide is selected from zirconium (IV) n-butoxide (Zr(OBu)$_4$), titanium (IV) ethoxide, titanium (IV) butoxide, aluminumtrisec-butoxide, or tetramethyl orthosilicate. In some embodiments, the metal alkoxide is zirconium n-butoxide. In other embodiments, the metal alkoxide is titanium ethoxide. In some other embodiments, the metal alkoxide is titanium butoxide. In some embodiments, the metal alkoxide is aluminumtrisec-butoxide. In some other embodiments, the metal alkoxide is tetramethyl orthosilicate.

In some embodiments, the methods include a metal halide selected $ZrCl_3$, $YCl_3$, $MgCl_2$, or $AlCl_3$. In some embodiments, the methods include a metal halide selected from $ZrCl_3$. In other embodiments, the methods include a metal halide selected from $YCl_3$. In yet other embodiments, the methods include a metal halide selected from $MgCl_2$. In still other embodiments, the methods include a metal halide selected from $AlCl_3$.

Some of the methods set forth herein include using organic acids, such as, for example but not limited to, acetic acid (BDH). The methods set forth herein include using inorganic acids, such as, for example but not limited to, HCl (37 wt %). The methods set forth herein include using solvents, such as, for example but not limited to, absolute ethanol In some of the methods set forth herein, the lanthanide halide is selected from $YbCl_3$, $TmCl_3$, $ErCl_3$, $DyCl_3$, or $NdCl_3$. In some embodiments, the lanthanide halide is $YbCl_3$, $TmCl_3$, $ErCl_3$, $DyCl_3$, or $NdCl_3$. In some other embodiments, the lanthanide halide is $YbCl_3$. In certain embodiments, the lanthanide halide is $TmCl_3$. In other embodiments, the lanthanide halide is $ErCl_3$. In other embodiments, the lanthanide halide is $DyCl_3$. In other embodiments, the lanthanide halide is $NdCl_3$.

In some of the methods set forth herein, the solution in step A includes the following components, initially at the beginning of the reaction, and at the following respective molar ratios: 1 Zr(OBu)$_4$:4 acetic acid:2.4 HCl:100 EtOH: 0.01 F127:0.4 YbCl$_3$.

In some embodiments, the present invention provides a Yb-doped $ZrO_2$ prepared by the method set forth herein. In certain embodiments, the Yb-doped $ZrO_2$ has a microsphere morphology.

In the some of the methods set forth herein, the step of passing the nebulized solution through a furnace includes using an $N_2$ carrier gas at about 1.5 standard liter per minute flow rate. In certain embodiments, this step includes using a glass tube furnace set at 400° C. The temperature of the tube furnace may include a temperature from about 200° C. to about 500° C. The temperature of the tube furnace may include a temperature from about 300° C. to about 400° C. or from about 350° C. to about 450° C. In certain other embodiments, the residence time of the nebulized solution in the furnace in this step is about 5 seconds. In some embodiments, the residence time can range from about 1 to about 20 seconds. In some embodiments, the residence time is about 1 to about 5 seconds or about 5 to about 10 seconds.

In some embodiments of the present invention, the methods include a calcining step wherein a material described herein is heated to about 800° C. for about 4 hours in air. In some embodiments, the temperature is about 600, 700, 800, or 900° C. In other embodiments, the temperature is about 650, 750, 850, or 950° C. In still other embodiments, the present invention provides methods wherein the temperature of the calcining step is 700° C. In other embodiments, the present invention provides methods wherein the temperature of the calcining step is 750° C. In yet other embodiments, the present invention provides methods wherein the temperature of the calcining step is 850° C.

In some embodiments, the present invention provides a method for preparing a doped oxide having a milli-sphere morphology. The method includes arc melting a doped oxide, described herein, having a micro-sphere.

In some embodiments, arc melting includes using standard arc melting furnaces. Standard arc melting furnaces typically include at least a furnace chamber, a view port, at water cooled hearth (cathode), a DC power supply, a vacuum system capable of providing up to $1 \times 10^{-6}$ mbar vacuum.

In some embodiments, arc melting includes any of the following steps. A) Operating a cooling system to cool the arc melting apparatus, e.g., using a water supply system. B) Operating an argon (Ar) gas supply or other inert gas supply to introduce gas in a sample chamber. In some embodiments, the output pressure for the argon gas supply is about 10 L/min. C) Loading a sample, e.g., a sensitized oxide, in the sample chamber. D) Operating a vacuum system associated with the sample chamber. E) Introducing Ar or some other inert gas into the sample chamber. In some embodiments, the sample chamber has a pressure of about 10 mm Hg. In certain embodiments, the pressure of the sample chamber is static. In other embodiments, the pressure of the sample chamber is dynamic. F) Operating the furnace current. In some embodiments, operating the furnace current includes adjusting the furnace current. In some embodiments, operating the furnace current includes moving the Tungsten (W) electrode to obtain an arc (i.e., plasma) that contact the sample in the sample chamber. G) Melting the sample. In some embodiments, melting the sample includes moving the W electrode towards or away from the sample. K) Removing the arc from the sample.

Devices and Applications

In some embodiments, the present invention provides a photovoltaic device or broadband light source including a doped oxide as set forth herein. In other embodiments, the present invention provides a broadband light having a high color rendering index above 98. In certain embodiments, the present invention provides a doped oxide prepared by a method as set forth herein.

In other embodiments, the present invention provides a broadband light having a high color rendering index above 90, 91, 92, 93, 94, 95, 96, 97, 98, 99, or 100.

Figure 2:
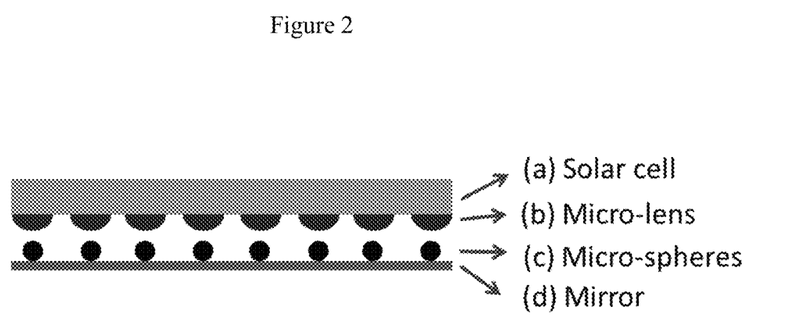
FIG. 2 shows a schematic of an embodiment of the present invention wherein the doped oxides set forth herein are incorporated in a thin-film solar cell.

FIG. 2 shows an embodiments of the present invention wherein a doped oxide is included in a thin-film solar cell.

From top to bottom, vertically, the solar cell in FIG. 2 includes a top layer thin-film solar cell photovoltaic layer. This thin-film solar cell photovoltaic layer may be a silicon-based solar cell. This thin-film solar cell photovoltaic layer may be partially or completely transparent to infrared light or infrared radiation Infrared radiation that transmits through the thin-film solar cell photovoltaic layer is focused by the micro-lenses onto the micro-spheres which are positioned below the micro-lenses. Underneath the micro-spheres is a mirror that reflects the emitted white light back up to the solar cell photovoltaic layer for use in photovoltaic energy generation.

As shown in FIG. 2, the mirror reflects the light emitted from the micro-spheres onto the solar cell photovoltaic layer. In doing so, the photovoltaic layer is able to absorb more photons than it otherwise would have absorbed because the infrared light, which the layer could not absorb, is upconverted and reflected and, or, directed radiated onto the photovoltaic layer as visible light, which the photovoltaic layer can absorb.

FIG. 2 shows some of the elements, from top to bottom, in a thin-film solar cell. (a) These elements include micro-lens (b), sensitized oxide micro-spheres (c), and a mirror (d). When solar light radiates onto the solar cell, the low energy photons transmit through the top layer. The low energy photons are focused by the micro-lens onto the sensitized oxide micro-spheres. The micro-spheres then radiate high energy visible photons, thereby generating white light. The high energy photons are reflected by the mirror back to the solar cell photovoltaic layer. Once absorbed by the photovoltaic layer, free carriers are generated in the solar cell photovoltaic layer which results in electrical energy generation. The doped oxides may be incorporated into a solar cell by immobilizing the oxides onto the mirror (e.g., as shown in FIG. 2) using lithographic methods or ink jet printing.

EXAMPLES

Example 1

Ultrasonic Spray Pyrolysis Preparation of Doped Oxides

Ultrasonic spray pyrolysis was used to prepare $Yb^{3+}$ doped $ZrO_2$ microspheres. A precursor solution was made by dissolving the block copolymer F127 (Sigma), zirconium butoxide ($Zr(OBu)_4$) (Aldrich), acetic acid (BDH), ytterbium chloride ($YbCl_3$) (Aldrich), and HCl (37 wt %, Fisher Scientific) in absolute ethanol (Scharlau). The molar ratios of the components in the precursor solutions were initially 1 $Zr(OBu)_4$:4 acetic acid:2.4 HCl:100 EtOH:0.01 F127:0.4 $YbCl_3$. The solutions were stirred vigorously for two hours. Then, an aerosol spray process was conducted.

Figure 1:
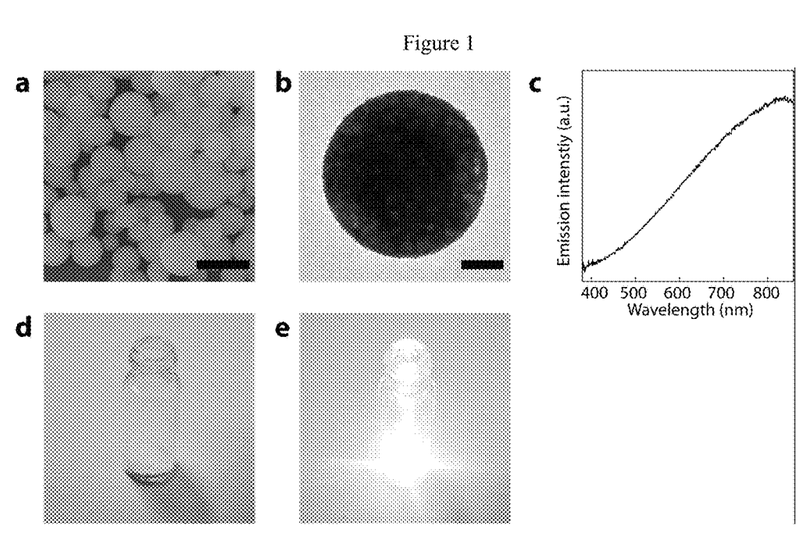
FIG. 1 shows sensitized mesoporous $ZrO_2$ according to one embodiment of the present invention.

For the aerosol spray process, the mixed solution was transferred into a household ultrasonic humidifier (1.7 MHz, 30 W) for nebulization. The generated mist was carried by $N_2$ (1.5 standard liter per minute) into a glass tube heating zone in a tube furnace set at 400° C. In the heating zone, the aerosol droplets dry and the surfactants assemble into micelles. These micelles direct the formation of mesostructured spheres which forms around and within these micelles. The residence time of the aerosol droplets in the heating zone is approximately 5 seconds. The resultant microspheres were collected using a filter paper, and calcined at 800° C. for 4 hours in air. The prepared materials are shown in FIG. 1, as noted above.

Example 2

Sol-Gel Precipitation Preparation of Doped Oxides

Sol-gel Precipitation was used to prepare $Yb^{3+}$ doped $ZrO_2$ microspheres. A precursor solution was made by dissolving the block copolymer F127 (Sigma), zirconium butoxide ($Zr(OBu)_4$) (Aldrich), acetic acid (BDH), ytterbium chloride ($YbCl_3$) (Aldrich), and HCl (37 wt %, Fisher Scientific) in absolute ethanol (Scharlau). The molar ratios of the components in the precursor solutions were initially 1 $Zr(OBu)_4$:4 acetic acid:2.4 HCl:100 EtOH:0.01 F127:0.4 $YbCl_3$. The solutions were stirred vigorously for two hours. Then the solution was put into an oven keep a temperature of 150° C. for 24 hours until the solvent was evaporated completely. The dried sample was annealed at 800° C. for 4 hours at a ramp rate of 1° C./minute to get the final doped oxides.

Although the foregoing invention has been described in some detail by way of illustration and example for purposes of clarity of understanding, one of skill in the art will appreciate that certain changes and modifications may be practiced within the scope of the appended claims. In addition, each reference provided herein is incorporated by reference in its entirety to the same extent as if each reference was individually incorporated by reference. Where a conflict exists between the instant application and a reference provided herein, the instant application shall dominate.

What is claimed is:

1. A doped oxide, comprising
   A) an oxide host having:
      i) a melting point greater than 1800 K; and
      ii) a room temperature thermal conductivity lower than 45 $W \cdot m^{-1} \cdot K^{-1}$; and
   B) a dopant uniformly distributed in the oxide host, wherein the doped oxide is in the form of mesoporous microspheres having a diameter of about 10 to 50 μm, wherein the surface area of the mesoporous microspheres is about 1 to 200 $m^2/g$, and wherein the mesoporous microspheres have a pore size of about 2 to 100 nm.

2. The oxide of claim 1, wherein the host comprises $ZrO_2$, $SiO_2$, $Y_2O_3$, MgO, $TiO_2$, $Al_2O_3$, ZnO, or $CeO_2$.

3. The oxide of claim 1, wherein the dopant comprises a rare earth cation.

4. The oxide of claim 1, wherein the dopant comprises $Yb^{3+}$, $Er^{3+}$, $Dy^{3+}$, $Tm^{3+}$, or $Nd^{3+}$.

5. A method of generating white light from infrared light, comprising directing infrared radiation onto the oxide of claim 1 to stimulate the dopant therein; thereby generating white light.

6. The method of claim 5, wherein the white light is a continuous spectrum.

7. The method of claim 5, wherein the white light is a continuous spectrum about 380 nm to about 980 nm and has a line width at half height greater than about 200 nm.

8. The method of claim 5, wherein the generating occurs at room temperature.

9. The method of claim 5, wherein the infrared radiation has a wavelength of about 780 to about 1600 nm.

10. The method of claim 5, wherein the infrared radiation has a wavelength of about 976±15 nm.

11. The method of claim 5, wherein the white light has a line width at half height greater than about 200 nm.

12. The method of claim 5, wherein the white light has a wavelength of about 380 nm to about 780 nm.

13. The method of claim 5, wherein the white light has a wavelength of about 380 nm to about 980 nm.

14. The oxide of claim 1, wherein the surface area of the mesoporous microspheres is about 100 $m^2/g$.

15. The oxide of claim 1, wherein the mesoporous microspheres have a pore size of about 3 to 15 nm.

* * * * *